(12) United States Patent
Wan

(10) Patent No.: US 11,622,433 B2
(45) Date of Patent: Apr. 4, 2023

(54) DISPLAY PANEL, MANUFACTURING METHOD AND DRIVE CONTROL METHOD THEREOF, AND DISPLAY APPARATUS

(71) Applicants: Hefei BOE Joint Technology Co., Ltd., Anhui (CN); BOE Technology Group Co., Ltd., Beijing (CN)

(72) Inventor: Xiang Wan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 292 days.

(21) Appl. No.: 16/925,284

(22) Filed: Jul. 9, 2020

(65) Prior Publication Data

US 2021/0068232 A1    Mar. 4, 2021

(30) Foreign Application Priority Data

Aug. 26, 2019    (CN) .......................... 201910791688.2

(51) Int. Cl.
| | |
|---|---|
| H05B 45/60 | (2022.01) |
| G09G 3/3225 | (2016.01) |
| H01F 7/20 | (2006.01) |
| H01L 27/32 | (2006.01) |
| H01L 51/56 | (2006.01) |

(52) U.S. Cl.
CPC ........... *H05B 45/60* (2020.01); *G09G 3/3225* (2013.01); *H01F 7/20* (2013.01); *H01L 27/3246* (2013.01); *H01L 51/56* (2013.01); *G09G 2320/0209* (2013.01); *G09G 2320/0242* (2013.01)

(58) Field of Classification Search
CPC ........ H05B 45/60; G09G 3/3225; H01F 7/20; H01L 27/3246; H01L 51/56
USPC ............................... 315/51; 257/40; 345/173
See application file for complete search history.

(56) References Cited

U.S. PATENT DOCUMENTS

| | | | |
|---|---|---|---|
| 10,739,890 B2 * | 8/2020 | Kurasawa ............ | G02B 6/0056 |
| 2014/0110683 A1 * | 4/2014 | Huang .................. | G06F 3/0443 |
| | | | 257/40 |
| 2014/0159018 A1 * | 6/2014 | Song ....................... | H01L 51/52 |
| | | | 257/40 |
| 2016/0018694 A1 * | 1/2016 | Zhou .................... | G02F 1/13394 |
| | | | 445/58 |
| 2016/0109988 A1 * | 4/2016 | Wang .................. | G06F 3/03545 |
| | | | 345/173 |
| 2016/0351092 A1 * | 12/2016 | Chen .................... | G09G 3/3233 |
| 2018/0074623 A1 * | 3/2018 | Xi ............................ | G06F 3/046 |
| 2019/0326542 A1 * | 10/2019 | Yang ................... | H01L 51/5056 |

\* cited by examiner

*Primary Examiner* — Prabodh M Dharia
(74) *Attorney, Agent, or Firm* — Ling Wu; Stephen Yang; Ling and Yang Intellectual Property

(57) ABSTRACT

A display panel includes a drive substrate, a first electrode disposed on the drive substrate and located in a pixel region, and a pixel defining layer disposed on the first electrode and defining the pixel region. The display panel further includes a light-emitting structure layer disposed on the pixel defining layer, a second electrode disposed on the light-emitting structure layer, and a magnetic field disposed at least one pixel region, wherein a direction of the magnetic field forms an included angle with a plane of the drive substrate.

17 Claims, 4 Drawing Sheets

DISPLAY PANEL, MANUFACTURING METHOD AND DRIVE CONTROL METHOD THEREOF, AND DISPLAY APPARATUS

CROSS-REFERENCE TO RELATED APPLICATION

The present application claims the priority of Chinese patent application No. 201910791688.2 filed to the CNIPA on Aug. 26, 2019, the content of which is hereby incorporated by reference.

TECHNICAL FIELD

The present disclosure relates to, but is not limited to, the field of display technology, and particularly relates to a display panel, a manufacturing method and a drive control method thereof, and a display apparatus.

BACKGROUND

Organic Light-Emitting Diode (OLED) is a next generation flat display panel after liquid crystal display panel, and has characteristics such as all solid state, self-luminous, high contrast, wide viewing angle and the like.

A Large size OLED display panel generally adopts a scheme of combining white light OLED with color filters to generate red light, green light and blue light. White light OLED usually uses stacked 2 or 3 sub-light-emitting layers to generate white light.

The OLED display panel adopting the combination scheme of white light OLED and color filter has defects such as cross color or crosstalk, which makes monochrome display unsaturated, reduces color gamut, etc., and adversely affects the display performance of the OLED display panel.

SUMMARY

The following is a summary of the subject matter described in detail in the present disclosure. This summary is not intended to limit a scope of protection of the claims.

In an aspect, an embodiment of the present disclosure provides a display panel having a plurality of pixel regions. The display panel includes a drive substrate, a first electrode disposed on the drive substrate and located in the pixel region, and a pixel defining layer disposed on the first electrode and defining the pixel region. The display panel further includes a light-emitting structure layer disposed on the pixel defining layer and a second electrode disposed on the light-emitting structure layer. The display panel further includes a magnetic field disposed on at least one of the pixel regions, a direction of the magnetic field forming an included angled with a plane of the drive substrate.

In some possible implementations, the direction of the magnetic field is perpendicular to the drive substrate.

In some possible implementations, the display panel further includes a current coil disposed around the pixel region within the pixel defining layer, both ends of the current coil are electrically connected to the drive substrate, the drive substrate is configured to provide a current to the current coil corresponding to the pixel region.

In some possible implementations, a central axis of the current coil is perpendicular to the drive substrate.

In some possible implementations, the pixel defining layer includes a first sub-defining layer disposed on the first electrode and a second sub-defining layer disposed on the first sub-defining layer. The current coil includes a first spiral segment and a second spiral segment, the first spiral segment is disposed on a same layer as the first electrode, and the second spiral segment is disposed between the first sub-defining layer and the second sub-defining layer. The start terminal of the first spiral segment is electrically connected with the drive substrate, one terminal of the second spiral segment is electrically connected to an end terminal of the first spiral segment through a first via passing through the first sub-defining layer, and the other terminal of the second spiral segment is electrically connected to the drive substrate through a second via passing through the first sub-defining layer.

In some possible implementations, central axes of the first spiral segment and the second spiral segment coincide with each other, and the central axes of the first spiral segment and the second spiral segment are perpendicular to the drive substrate.

In some possible implementations, in a direction perpendicular to the drive substrate, the second spiral segment is located outside the first spiral segment.

In some possible implementations, in a direction perpendicular to the drive substrate, the second spiral segment is located inside the first spiral segment.

In some possible implementations, the light-emitting structure layer includes a plurality of stacked sub-light-emitting layers, and a charge generation layer is disposed between adjacent sub-light-emitting layers.

In some possible implementations, the light-emitting structure layer emits white light, and the display panel further includes a color filter substrate disposed on a side of the second electrode departing from the drive substrate, the color filter substrate is provided with a color filter corresponding to the pixel region.

In some possible implementations, the display panel includes a plurality of pixel regions, and each of the pixel regions is provided with the magnetic field.

In another aspect, an embodiment of the present disclosure further provides a drive control method for a display panel which includes a drive substrate, a first electrode disposed on the drive substrate and located in a pixel region, a pixel defining layer disposed on the first electrode and defining the pixel region, a light-emitting structure layer disposed on the pixel defining layer, and a second electrode disposed on the light-emitting structure layer. The drive control method includes: providing a magnetic field to a corresponding pixel region.

In some possible implementations, the display panel further includes a current coil disposed around the pixel region within the pixel defining layer, both ends of the current coil are electrically connected to the drive substrate, providing the magnetic field to the corresponding pixel region includes: providing the current to the current coil corresponding to the pixel region by the drive substrate.

In yet another aspect, an embodiment of the present disclosure further provides a method for manufacturing a display panel. The method includes: providing a drive substrate; forming a first electrode located in a pixel region, a current coil surrounding the pixel region and a pixel defining layer on the drive substrate, the pixel defining layer defining the pixel region; forming a light-emitting structure layer and a second electrode on the pixel defining layer sequentially.

In some possible implementations, forming the first electrode located in the pixel region, the current coil surrounding the pixel region and the pixel defining layer on the drive substrate, the pixel defining layer defining the pixel region, includes: forming the first electrode and a first spiral segment surrounding an outer side of the first electrode on the drive substrate; forming a first sub-defining layer on the drive substrate on which the first electrode and the first spiral segment have been formed, wherein the first sub-defining layer defines the pixel region, and the first sub-defining layer is provided with a first via exposing an end terminal of the first spiral segment and a second via exposing the drive substrate; forming a second spiral segment surrounding an outer side of the pixel region on the first sub-defining layer, wherein a start terminal of the second spiral segment is electrically connected with the end terminal of the first spiral segment through the first via, and an end terminal of the second spiral segment is electrically connected with the drive substrate through the second via; forming a second sub-defining layer on the drive substrate on which the second spiral segment has been formed, the second sub-defining layer defining the pixel region.

An embodiment of the disclosure further provides a display apparatus which includes a display panel described above.

Other features and advantages of technical solutions of the present disclosure will be set forth in the description which follows, and in part will become apparent from the description, or be learned by practice of the technical solutions of the present disclosure. Purposes and other advantages of the technical solutions of the present disclosure may be realized and obtained by structures specifically pointed out in the specification, claims and accompanying drawings.

BRIEF DESCRIPTION OF DRAWINGS

The accompanying drawings are used to provide a further understanding of the technical solutions of the present disclosure and form a part of the specification. Together with the embodiments of the present disclosure, they are used to explain the technical solutions of the present disclosure and do not constitute a limitation on the technical solutions of the present disclosure.

FIG. 5b is a schematic top view of FIG. 5a.

FIG. 7b is a schematic top view of FIG. 7a.

DETAILED DESCRIPTION

To make the objects, technical solutions and advantages of the present disclosure more clear, embodiments of the present disclosure will be described in detail below with reference to the accompanying drawings.

Those skilled in the art should understand that embodiments in the present disclosure and features in the embodiments may be combined with each other arbitrarily if there is no conflict.

In the present disclosure, "parallel" refers to a state in which two straight lines form an angle of −10 degrees or more and 10 degrees or less, and thus also includes a state in which the angle is −5 degrees or more and 5 degrees or less. In addition, "vertical" refers to a state in which an angle of 80 degrees or more and 100 degrees or less is formed, and thus also includes a state of an angle being 85 degrees or more and 95 degrees or less.

Large size OLED display panels generally adopt a scheme of combining white light OLED with color filters to generate red light, green light and blue light. A white light OLED may use stacked 2 or 3 sub-light-emitting layers to generate white light, and adjacent sub-light-emitting layers are connected by a charge generation layer (CGL) to reduce a voltage of a white light OLED device. The charge generation layer needs to be made of a material with a strong conductivity. Active metals such as lithium may be doped in the charge generation layer to improve the conductivity of the charge generation layer.

However, the charge generation layer has a strong conductive capability, which may cause charges in the charge generation layer to generate transverse transmission, and aging of an organic material in the pixel region may further cause the transverse transmission of the charges. Therefore, when the display panel displays a monochrome image (i.e., a pure color image, such as a red image, a green image or a blue image), the charges transversely transmitted to an adjacent OLED may cause adjacent OLED pixels to brighten, generate a defect of crosstalk, make monochrome display unsaturated, reduce color gamut, etc., and affect display performance of the OLED display panel.

Figure 1:
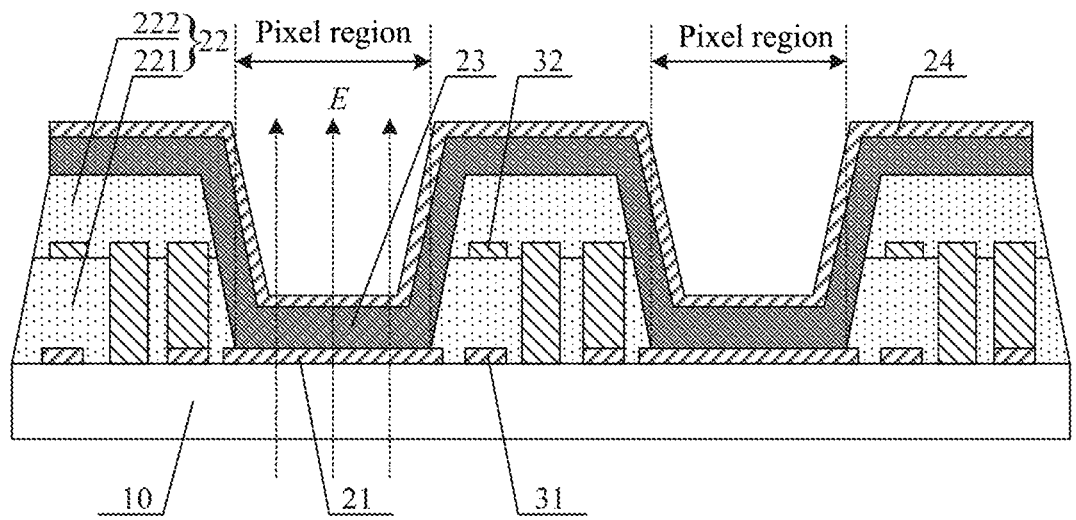
FIG. 1 is a schematic cross-sectional structural view of a display panel according to an exemplary embodiment of the present disclosure.

FIG. 1 is a schematic cross-sectional structural view of a display panel according to an exemplary embodiment of the present disclosure.

As shown in FIG. 1, the display panel includes multiple pixel regions. The display panel includes a drive substrate 10, a first electrode 21 disposed on the drive substrate 10 and located in a pixel region, and a pixel defining layer 22 disposed on the first electrode 21, the pixel defining layer 22 defining the pixel region. The display panel further includes a light-emitting structure layer 23 disposed on the pixel defining layer 22 and a second electrode 24 disposed on the light-emitting structure layer 23. The display panel further includes a magnetic field E disposed in at least one pixel region, a direction of the magnetic field forming an included angle with a plane on which the drive substrate 10 is located, the magnetic field is used for inhibiting transverse transmission of charges in the light-emitting structure layer. Those skilled in the art will understand that the first electrode 21 may be an anode and the second electrode 24 may be a cathode.

When a charged particle moves in a magnetic field, the charged particle will be subjected to Lorentz force, the magnitude of which is f, $f=qvB\sin\theta$, herein q is an amount of charges of the charged particle, v is a moving speed of the charged particle, b is a magnetic induction strength of the magnetic field, and $\theta$ is an included angle between a direction of the magnetic field and a moving direction of the charged particle.

The display panel according to the embodiment of the present disclosure includes a magnetic field disposed in a pixel region, and a direction of the magnetic field forms a certain included angle with the plane on which the drive substrate 10 is located. When charges (electrons or holes) in the light-emitting structure layer 23 are transversely transmitted (in a direction parallel to the drive substrate 10), as the direction of the magnetic field forms a certain included angle with the plane on which the drive substrate 10 is located (i.e., θ>0), the magnetic field generates a Lorentz force on the electrons or holes, a motion direction of the electrons or holes is changed to enable the electrons or holes to perform spiral motion, thus greatly increasing the route of the electrons or holes, limiting the transverse transmission of the electrons or holes, reducing brightness of adjacent pixels, avoiding a defect of crosstalk, enhancing saturation and color gamut of a monochrome display, and improving display quality of the display panel.

Those skilled in the art can understand that due to an opposite polarity of charges of an electron and a hole, Lorentz force generated by the magnetic field on the electron and the hole have different directions, so that the electron or the hole moves separately from each other during the spiral motion.

In an exemplary embodiment, the direction of the magnetic field is perpendicular to the drive substrate 10. When the direction of the magnetic field is perpendicular to the drive substrate 10, the direction of the magnetic field is parallel to a direction of holes or electrons for light emission, so that the magnetic field does not generate Lorentz force on the holes or electrons for light emission, and does not adversely affect the normal display of the display panel.

Figure 2:
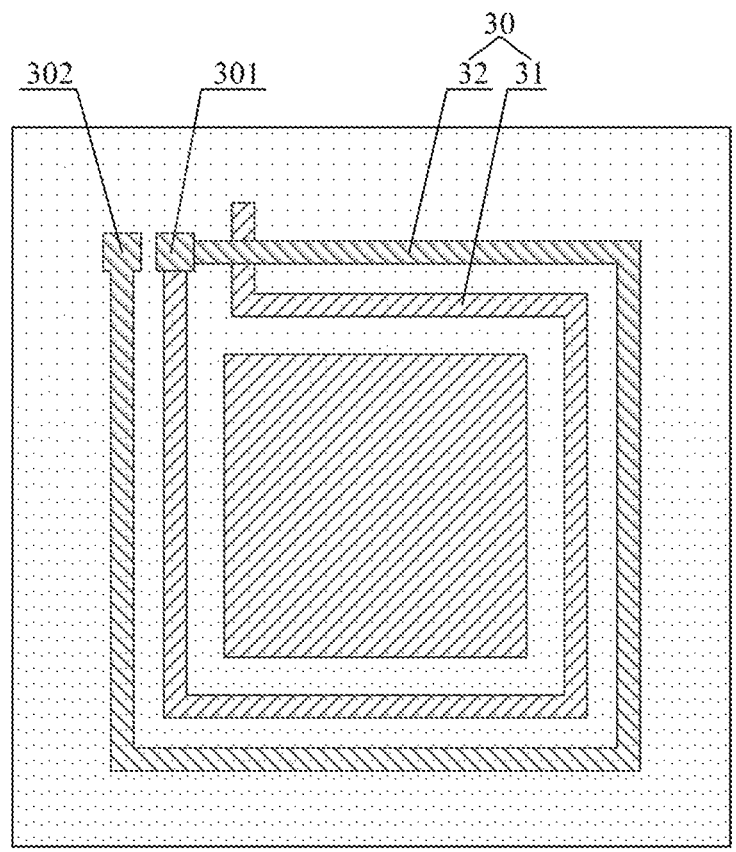
FIG. 2 is a schematic top view of a pixel region in the display panel shown in FIG. 1.

FIG. 2 is a schematic top view of a pixel region in the display panel shown in FIG. 1.

To make a magnetic field exist in a pixel region, in an exemplary embodiment, as shown in FIGS. 1 and 2, a current coil 30 disposed around the pixel region is disposed in the pixel defining layer 22, both ends of the current coil 30 are electrically connected with the drive substrate, and the drive substrate may provide a current to the current coil 30 to make the current coil 30 generate a magnetic field in the pixel region. Those skilled in the art may understand that when the drive substrate provides a current to the current coil 30, the current coil 30 may generate a magnetic field inside the current coil 30, i.e., in the pixel region, according to the Ampere rule.

In an exemplary embodiment, a central axis of the current coil 30 is perpendicular to the drive substrate. Thus, a direction of the magnetic field generated by the current coil 30 may be perpendicular to the drive substrate.

In an exemplary embodiment, as shown in FIGS. 1 and 2, the pixel defining layer 22 includes a first sub-defining layer 221 disposed on the drive substrate on which the first electrode has been formed and a second sub-defining layer 222 disposed on the first sub-defining layer 221, and the light-emitting structure layer 23 is disposed on the second sub-defining layer 222. The current coil 30 includes a first spiral segment 31 and a second spiral segment 32 connected to each other. The first spiral segment 31 is disposed on the drive substrate 10, and the first spiral segment 31 is disposed on a same layer as the first electrode 21 and is formed by a same patterning process as the first electrode 21. The first spiral segment 31 surrounds an outer side of the first electrode 21. A start terminal of the first spiral segment 31 is electrically connected with the drive substrate 10.

The first sub-defining layer 221 is provided with a first via 301 exposing an end terminal of the first spiral segment 31 and a second via 302 exposing the drive substrate 10. The second spiral segment 32 is disposed between the first sub-defining layer 221 and the second sub-defining layer 222, the second spiral segment 32 surrounds a periphery of a pixel region, one terminal of the second spiral segment 32 is connected with an end terminal of the first spiral segment 31 through a first via 301 passing through the first sub-defining layer 221, and the other terminal of the second spiral segment 32 is electrically connected with the drive substrate 10 through a second via 302 passing through the first sub-defining layer 221. Therefore, both ends of the current coil 30 are electrically connected with the drive substrate 10, and a current may be provided to the current coil 30 through the drive substrate 10 to generate a magnetic field in the pixel region.

In the current coil shown in FIG. 2, the second spiral segment 32 is located outside the first spiral segment 31. Since the first spiral segment 31 and the second spiral segment 32 are located on different layers, in other embodiments, a relative position of the second spiral segment 32 and the first spiral segment 31 may be set as required from a direction perpendicular to the drive substrate, for example, the second spiral segment may be located inside or outside the first spiral segment, or the second spiral segment may coincide with the first spiral segment.

In an embodiment shown in FIG. 2, the current coil includes a first spiral segment and a second spiral segment, and those skilled in the art will understand that the current coil may also include more turns of spiral segments, such as 3 turns, 4 turns, etc. The current coil may be formed by dividing the pixel defining layer into multiple sub-defining layers to form more turns of spiral segments which are sequentially connected, as long as both ends of the current coil are electrically connected with the drive substrate.

In an exemplary embodiment, central axes of the first spiral segment and the second spiral segment coincide with each other, and the central axes of the first spiral segment and the second spiral segment are perpendicular to the drive substrate, which ensures that a direction of the magnetic field generated by the current coil is perpendicular to the drive substrate.

In another embodiment, a current coil with an integral structure surrounding an outer side of a pixel region may be disposed on the drive substrate 10, such that both ends of the current coil are electrically connected with the drive substrate 10, respectively, and then a pixel defining layer 22 may be formed on the drive substrate 10 on which the current coil has been disposed to fix the current coil inside the pixel defining layer 22.

Those skilled in the art will understand that the drive substrate 10 may include a thin film transistor corresponding to each pixel, and the first electrode 21 may be electrically connected with a source electrode or a drain electrode of the thin film transistor. The drive substrate 10 may further include a current control unit, both ends of the current coil 30 are electrically connected with the current control unit, and the current control unit may apply a current to the current coil 30 to make a pixel region surrounded by the current coil generate a magnetic field. The current control unit is a circuit module commonly used in the field, and the current control unit may be disposed in the drive substrate by adopting a conventional technology in the field.

Figure 3:
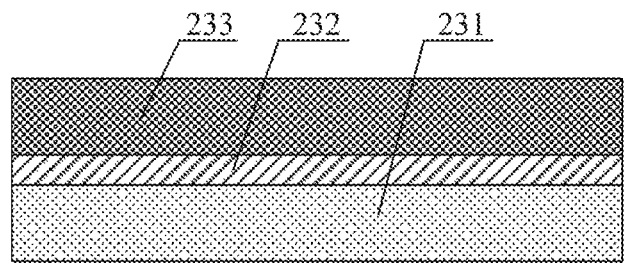
FIG. 3 is a schematic diagram of structure of a light-emitting structure layer in FIG. 1.

FIG. 3 is a schematic diagram of structure of a light-emitting structure layer in FIG. 1.

In an exemplary embodiment, the light-emitting structure layer includes multiple stacked sub-light-emitting layers, and a charge generation layer is disposed between adjacent sub-light-emitting layers. In an exemplary embodiment, as shown in FIG. 3, the light-emitting structure layer 23 includes a first sub-light-emitting layer 231 and a second sub-light-emitting layer 233 disposed in a stack, and a first charge generation layer 232 is disposed between the first sub-light-emitting layer 231 and the second sub-light-emitting layer 233. Emission colors of the first sub-light-emitting layer and the second sub-light-emitting layer may be determined as required.

Figure 4:
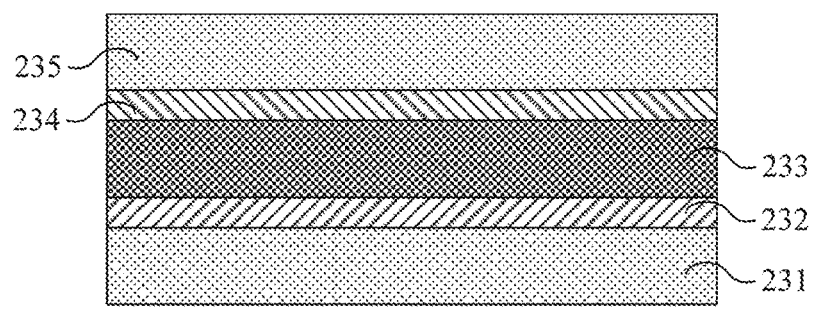
FIG. 4 is a schematic diagram of structure of a light-emitting structure layer according to an exemplary embodiment of the present disclosure.

FIG. 4 is a schematic diagram of structure of a light-emitting structure layer according to an exemplary embodiment of the present disclosure. In another embodiment, as shown in FIG. 4, the light-emitting structure layer 23 includes a first sub-light-emitting layer 231, a second sub-light-emitting layer 233, and a third sub-light-emitting layer 235 that are disposed in a stack, a first charge generation layer 232 is disposed between the first sub-light-emitting layer 231 and the second sub-light-emitting layer 233, and a second charge generation layer 234 is disposed between the second sub-light-emitting layer 233 and the third sub-light-emitting layer 235. The first sub-light-emitting layer 231, the second sub-light-emitting layer 233, and the third sub-light-emitting layer 235 may emit red light, green light, and white light, respectively, so that the light-emitting structure layer 23 may emit white light.

Those skilled in the art may understand that each sub-light-emitting layer may sequentially include a hole injection layer, a hole transport layer, an organic light-emitting material layer, an electron transport layer, and an electron injection layer. Those skilled in the art may understand that the hole injection layer of multiple pixel regions may be of an integrated structure, and the hole transport layer, the electron transport layer, and the electron injection layer of the multiple pixel regions may also be of an integrated structure, respectively.

In an OLED pixel unit of the stacked structure, for each sub-light-emitting layer, organic light-emitting material layers of the multiple pixel regions may also be of an integrated structure, for example, a first organic light-emitting material layer in the first sub-light-emitting layer of multiple pixel regions is of an integrated structure, or organic light-emitting material layers of multiple pixel units are separately disposed in corresponding pixel regions, that is, the organic light-emitting material layers in each pixel region are independent from each other. For example, in the light-emitting structure layer as shown in FIG. 4, since a color emitted by the first sub-light-emitting layer in each pixel unit is the same, a first organic light-emitting material layer in each pixel unit may be an integrated structure that is connected, or the first organic light-emitting material layer in each pixel unit is separately disposed in a corresponding pixel region, that is, the first organic light-emitting material layers in each pixel region are independent from each other.

An embodiment of the present disclosure further provides a drive control method of a display panel. The display panel includes a drive substrate, a first electrode disposed on the drive substrate and located in a pixel region, and a pixel defining layer disposed on the first electrode, the pixel defining layer defining the pixel region. The display panel further includes a light-emitting structure layer disposed on the pixel defining layer and a second electrode disposed on the light-emitting structure layer. The drive control method includes the following act: providing a magnetic field to a corresponding pixel region, a direction of the magnetic field being perpendicular to the drive substrate.

In an exemplary embodiment, a current coil disposed around a pixel region is disposed in the pixel defining layer, both ends of the current coil are electrically connected with the drive substrate, and providing the magnetic field to the corresponding pixel region includes: providing the current to the current coil corresponding to the pixel region by the drive substrate.

Those skilled in the art may understand that when the light-emitting structure layers all emit white light, the display panel may further include a color filter substrate disposed on a side, departing from the drive substrate, of the second electrode 24, and the color filter substrate is provided with a color filter corresponding to a pixel region. The color filter may include a red color filter, a green color filter, and a blue color filter, so that the display panel may emit corresponding colors. When the display panel displays a monochrome image (i.e., a pure color image, such as a red image, a green image or a blue image), for example, the display panel displays a red image, by way of the drive control method according to the embodiment of the present disclosure, a current may be provided to a current coil in the red pixel region, thereby generating a magnetic field perpendicular to the drive substrate in the red pixel region, which may inhibit the transverse transmission of electrons or holes in the light-emitting structure layer, prevent adjacent pixel units (green pixel units and blue pixel units) from emitting light, thereby avoiding a defect of crosstalk, enhancing saturation and color gamut of a monochrome display, and improving display quality of the display panel.

An embodiment of the present disclosure further provides a method for manufacturing a display panel, which includes the following acts: providing a drive substrate; forming a first electrode located in a pixel region, a current coil surrounding the pixel region and a pixel defining layer on the drive substrate, the pixel defining layer defining the pixel region; and forming a light-emitting structure layer and a second electrode on the pixel defining layer sequentially.

The following is a detailed description of the technical solution of the method for manufacturing the display panel with a manufacturing process of the display panel.

Herein, a "patterning process" in the present disclosure includes deposition of a film layer, coating of photoresist, mask exposure, development, etching, stripping of photoresist, etc. A "photolithography process" in the present disclosure includes coating of a film layer, mask exposure, development, etc. The evaporation, deposition, coating, spreading, etc. in the present disclosure are mature manufacturing processes in related technologies.

In an exemplary embodiment, the process for manufacturing a display panel includes the following operations S1-S3.

S1: providing a drive substrate 10 on which multiple pixel regions are disposed.

S2: forming a first electrode located in a pixel region, a current coil surrounding the pixel region and a pixel defining layer on the drive substrate, the pixel defining layer defining the pixel region. This act may include the following operations S21-S24.

Figure 5A:
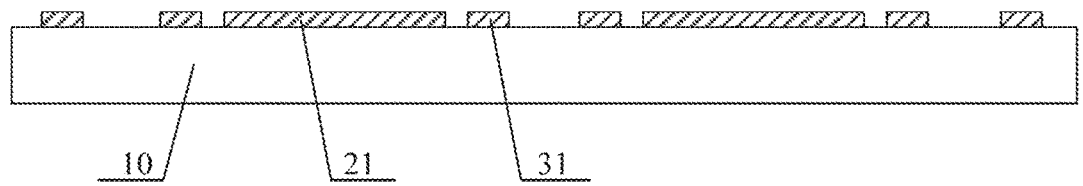
FIG. 5a is a schematic cross-sectional structural view of a display panel after forming a first electrode and a first spiral segment.
Figure 5B:
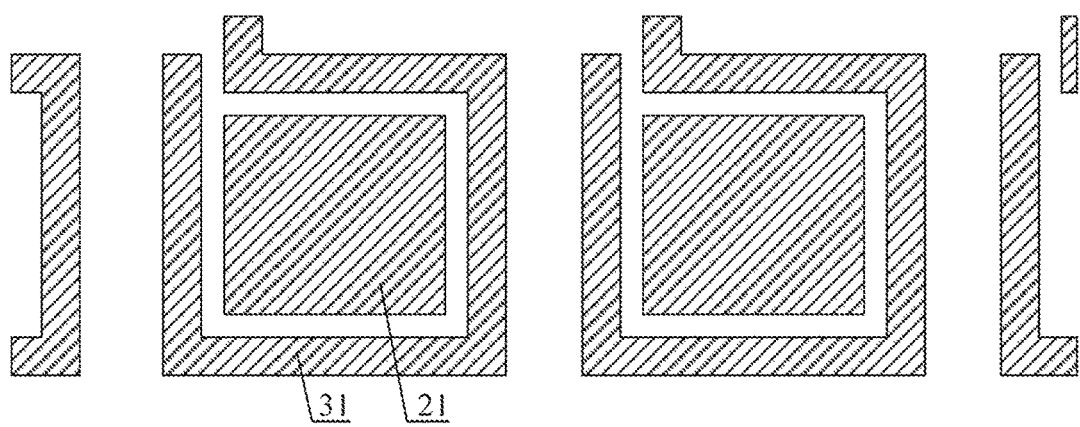

S21: forming a first electrode and a first spiral segment around an outer side of the first electrode on the drive substrate, which may include depositing a first metal film on the drive substrate 10, forming a first electrode 21 located in the pixel region and a first spiral segment 31 surrounding the first electrode 21 by a patterning process. As shown in FIGS. 5a and 5b, FIG. 5a is a schematic cross-sectional structural view of a display panel after forming the first electrode and the first spiral segment in the display panel, FIG. 5b is a schematic top view of FIG. 5a, and FIG. 5b only shows a structure of the first spiral segment 31. Herein, a material of the first metal film may be at least one of transparent conductive materials such as indium tin oxide (ITO) and indium zinc oxide (IZO). The first spiral segment 31 may constitute a first turn of the current coil.

Figure 6:
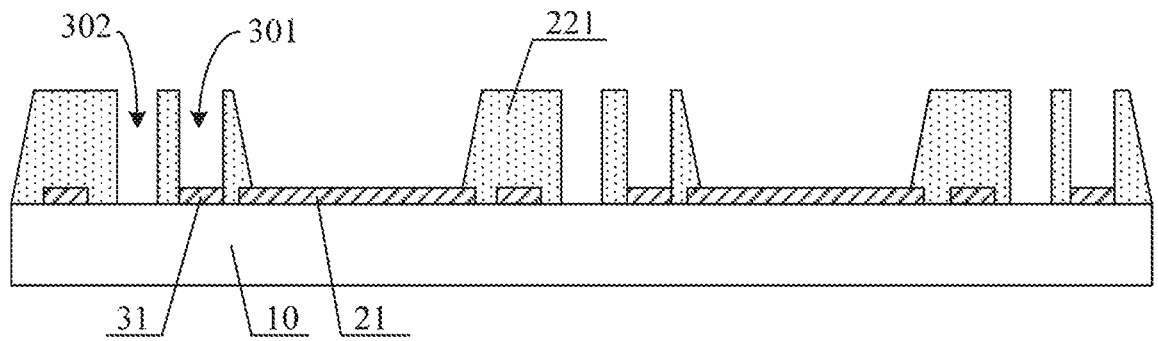
FIG. 6 is a schematic cross-sectional structural view of a display panel after forming a first sub-defining layer.

S22: forming a first sub-defining layer on the drive substrate on which the first electrode and the first spiral segment have been formed, which may include: coating a pixel defining film on the drive substrate 10 on which the first electrode 21 and the first spiral segment 31 have been formed, forming a first sub-defining layer 221 by a photolithography process. As shown in FIG. 6, FIG. 6 is a schematic cross-sectional structural view of a display panel after forming the first sub-defining layer in the display panel. The first sub-defining layer 221 defines a pixel region, and the first sub-defining layer 221 is provided with a first via 301 exposing an end terminal of the first spiral segment 31 and a second via 302 exposing the drive substrate 10. Those skilled in the art will understand that a start terminal of the first spiral segment 31 is electrically connected with the drive substrate.

Figure 7A:
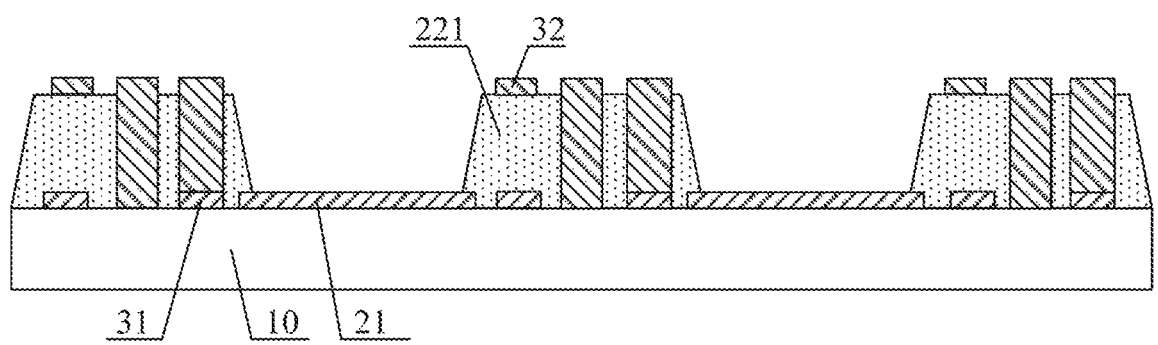
FIG. 7a is a schematic cross-sectional structural view of a display panel after forming a second spiral segment.
Figure 7B:
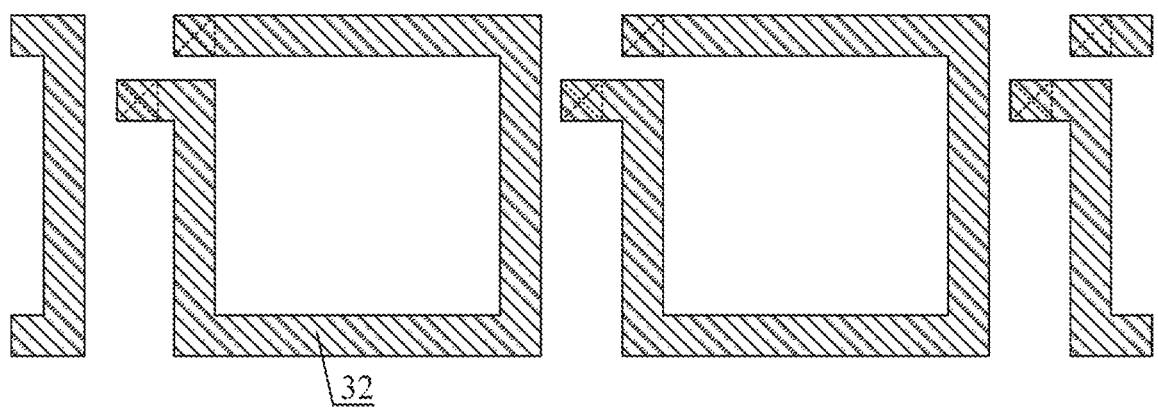

S23: forming a second spiral segment surrounding an outer side of the pixel region on the first sub-defining layer, which may include depositing a second metal film on the drive substrate 10 on which the first sub-defining layer has been formed, forming a second spiral segment 32 surrounding an outer side of the pixel region by a patterning process, a start terminal of the second spiral segment 32 being connected with the first spiral segment 31 through a first via 301, an end terminal of the second spiral segment 32 being electrically connected with the drive substrate 10 through the second via 302. As shown in FIGS. 7a and 7b, FIG. 7a is a schematic cross-sectional structural view of a display panel after forming a second spiral segment in the display panel, FIG. 7b is a schematic top view of FIG. 7a, and FIG. 7b only shows a structure of the second spiral segment 32. Herein, a material of the second metal film may be at least one of transparent conductive materials such as indium tin oxide (ITO) and indium zinc oxide (IZO). The second spiral segment 32 may constitute a second turn of the current coil.

Figure 8:
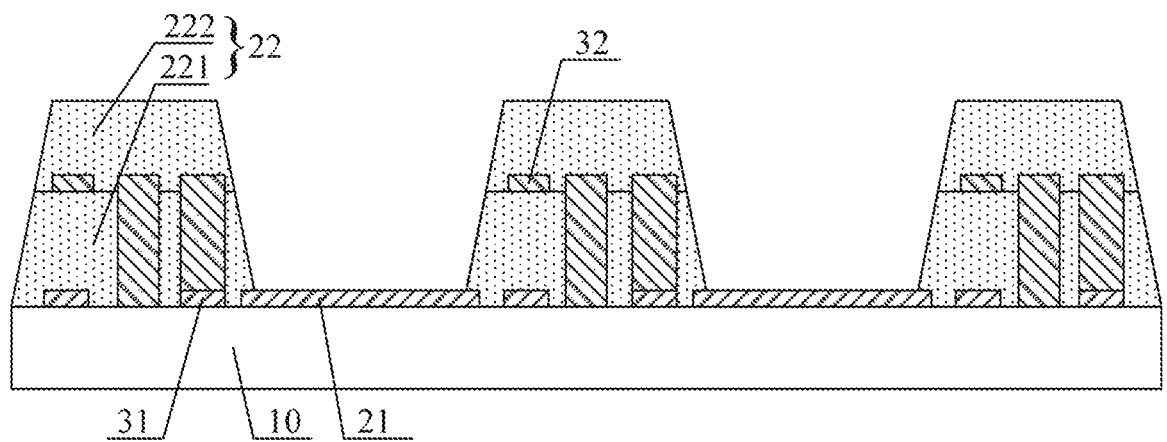
FIG. 8 is a schematic cross-sectional structural view of a display panel after forming a second sub-defining layer.

S24: coating a pixel defining film on the drive substrate 10 on which the second spiral segment 32 has been formed to form a second sub-defining layer 222 by a photolithography process. As shown in FIG. 8, FIG. 8 is a schematic cross-sectional structural view of a display panel after forming a second sub-defining layer in the display panel. The second sub-defining layer 222 defines a pixel region.

S3: sequentially forming a light-emitting structure layer 23 and a second electrode 24 on the pixel defining layer 22.

When the light-emitting structure layer is a light-emitting structure layer as shown in FIG. 4, forming the light-emitting structure layer 23 on the pixel defining layer 22 includes: forming a first sub-light-emitting layer 231 on the pixel defining layer 22, forming a first charge generation layer 232 on the first sub-light-emitting layer 231, forming a second sub-light-emitting layer 233 on the first charge generation layer 232, forming a second charge generation layer 234 on the second sub-light-emitting layer 233, and forming a third sub-light-emitting layer 236 on the second charge generation layer 234.

Processes known in the art may be adopted to form the sub-light-emitting layers and the charge generation layers, which are not be described in detail here.

An embodiment of the present disclosure further discloses a display apparatus including a display panel of the previous embodiment. The display apparatus may be any product or component with a display function such as a mobile phone, a tablet computer, a television, a display, a notebook computer, a digital photo frame, a navigator, etc.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the embodiments of present disclosure, unless otherwise clearly specified and defined, the terms "install", "connect" and "link" should be broadly interpreted, for example, it may be connected fixedly or connected detachably, or integrated, it may be a mechanical connection or an electrical connection, it may be directly connected, or may be indirectly connected through an intermediate medium, it may be an internal connection between two elements. Those of ordinary skills in the art may understand the specific meanings of the above terms in the present disclosure according to specific situations.

Although the embodiments disclosed in the present disclosure are as the above, the contents are only implementations for facilitating understanding the present disclosure and are not used to limit the present disclosure. One skilled in the art to which the present disclosure belongs may make any modifications and variations in forms and details of implementation without departing from the spirit and scope of the present disclosure. However, a protection scope of the present disclosure shall be determined by the scope as defined in the claims.

I claim:

1. A display panel having a plurality of pixel regions, comprising a drive substrate, a first electrode disposed on the drive substrate and located in a pixel region, and a pixel defining layer disposed on the first electrode and defining the pixel region, the display panel further comprising a light-emitting structure layer disposed on the pixel defining layer and a second electrode disposed on the light-emitting structure layer, the display panel further comprising a magnetic field disposed on at least one of the pixel regions, a direction of the magnetic field forming an included angle with a plane of the drive substrate, wherein the display panel further comprises a current coil disposed around the pixel region in the pixel defining layer, wherein both ends of the current coil are electrically connected with the drive substrate, and the drive substrate is configured to provide a current to the current coil corresponding to the pixel region to make the current coil generate the magnetic field in the pixel region.

2. The display panel according to claim 1, wherein the direction of the magnetic field is perpendicular to the drive substrate.

3. The display panel according to claim 1, wherein a center axis of the current coil is perpendicular to the drive substrate.

4. The display panel according to claim 1, wherein the pixel defining layer comprises a first sub-defining layer disposed on the first electrode and a second sub-defining layer disposed on the first sub-defining layer, the current coil comprises a first spiral segment and a second spiral segment, wherein the first spiral segment is disposed on a same layer as the first electrode, the second spiral segment is disposed between the first sub-defining layer and the second sub-defining layer, a start terminal of the first spiral segment is electrically connected with the drive substrate, one terminal of the second spiral segment is electrically connected with an end terminal of the first spiral segment through a first via passing through the first sub-defining layer, and the other terminal of the second spiral segment is electrically connected with the drive substrate through a second via passing through the first sub-defining layer.

5. The display panel according to claim 4, wherein central axes of the first spiral segment and the second spiral segment coincide with each other, and the central axes of the first spiral segment and the second spiral segment are perpendicular to the drive substrate.

6. The display panel according to claim 4, wherein the second spiral segment is located outside the first spiral segment in a direction perpendicular to the drive substrate.

7. The display panel according to claim 4, wherein the second spiral segment is located inside the first spiral segment in a direction perpendicular to the drive substrate.

8. The display panel according to claim 4, wherein the light-emitting structure layer comprises a plurality of stacked sub-light-emitting layers, and a charge generation layer is disposed between adjacent sub-light-emitting layers.

9. A display apparatus, comprising the display panel according to claim 4.

10. The display panel according to claim 1, wherein the light-emitting structure layer comprises a plurality of stacked sub-light-emitting layers, and a charge generation layer is disposed between adjacent sub-light-emitting layers.

11. The display panel according to claim 10, wherein the light-emitting structure layer emits white light, and the display panel further comprises a color filter substrate disposed on a side, away from the drive substrate, of the second electrode, and the color filter substrate is provided with a color filter corresponding to the pixel region.

12. The display panel according to claim 1, wherein the light-emitting structure layer comprises a plurality of stacked sub-light-emitting layers, and a charge generation layer is disposed between adjacent sub-light-emitting layers.

13. The display panel according to claim 1, wherein each of the pixel regions is provided with the magnetic field.

14. A display apparatus, comprising the display panel according to claim 1.

15. A drive control method for a display panel, the display panel having a drive substrate, a first electrode disposed on the drive substrate and located in a pixel region, a pixel defining layer disposed on the first electrode and defining the pixel region, a light-emitting structure layer disposed on the pixel defining layer, and a second electrode disposed on the light-emitting structure layer, wherein the display panel further comprises a current coil disposed around the pixel region in the pixel defining layer, both ends of the current coil are electrically connected with the drive substrate, the drive control method comprising:
providing a current to the current coil corresponding to the pixel region by the drive substrate.

16. A method for manufacturing a display substrate, comprising:
providing a drive substrate;
forming a first electrode located in a pixel region, a current coil surrounding the pixel region on the drive substrate and a pixel defining layer, the pixel defining layer defining the pixel region;
forming a light-emitting structure layer and a second electrode on the pixel defining layer sequentially, wherein both ends of the current coil are electrically connected with the drive substrate, the drive substrate is configured to provide a current to the current coil corresponding to the pixel region to make the current coil generate the magnetic field in the pixel region.

17. The method of claim 16, wherein forming the first electrode located in the pixel region, the current coil surrounding the pixel region and the pixel defining layer on the drive substrate, the pixel defining layer defining the pixel region, comprises:
forming the first electrode and a first spiral segment surrounding an outer side of the first electrode on the drive substrate;
forming a first sub-defining layer on the drive substrate on which the first electrode and the first spiral segment have been formed, the first sub-defining layer defining the pixel region, and the first sub-defining layer being provided with a first via exposing an end terminal of the first spiral segment and a second via exposing the drive substrate;
forming a second spiral segment surrounding an outer side of the pixel region on the first sub-defining layer, a start terminal of the second spiral segment being electrically connected with the end terminal of the first spiral segment through the first via, and an end terminal of the second spiral segment being electrically connected with the drive substrate through the second via;
forming a second sub-defining layer on the drive substrate on which the second spiral segment has been formed, the second sub-defining layer defining the pixel region.

\* \* \* \* \*